United States Patent
Sabi et al.

(10) Patent No.: US 7,427,431 B2
(45) Date of Patent: *Sep. 23, 2008

(54) WRITE ONCE OPTICAL RECORDING MEDIUM

(75) Inventors: Yuichi Sabi, Miyagi (JP); Mitsuaki Oyamada, Kanagawa (JP); Katsuhisa Aratani, Chiba (JP)

(73) Assignee: Sony Corporation, Tokyo (JP)

(*) Notice: Subject to any disclaimer, the term of this patent is extended or adjusted under 35 U.S.C. 154(b) by 539 days.

This patent is subject to a terminal disclaimer.

(21) Appl. No.: 11/111,740

(22) Filed: Apr. 22, 2005

(65) Prior Publication Data

US 2005/0276946 A1  Dec. 15, 2005

(30) Foreign Application Priority Data

Apr. 28, 2004  (JP) .............................. 2004-134039

(51) Int. Cl.
B32B 3/02 (2006.01)

(52) U.S. Cl. .................... 428/64.1; 428/64.4; 428/64.5; 430/270.13

(58) Field of Classification Search ................ 428/64.1, 428/64.4, 64.5, 64.6; 430/270.12, 270.13
See application file for complete search history.

(56) References Cited

U.S. PATENT DOCUMENTS

| 5,733,623 | A  | * | 3/1998 | Raychaudhuri et al. .... 428/64.1 |
| 6,040,066 | A  | * | 3/2000 | Zhou et al. .................... 428/641 |
| 6,445,675 | B1 | * | 9/2002 | Ebina et al. ............... 369/275.2 |
| 6,610,380 | B2 | * | 8/2003 | Kitaura et al. ............. 428/64.1 |
| 6,713,148 | B1 | * | 3/2004 | Hsu et al. ................... 428/64.1 |
| 7,057,252 | B2 | * | 6/2006 | Uno et al. ..................... 257/432 |
| 2004/0067332 | A1 | * | 4/2004 | Hsu et al. ................... 428/64.4 |
| 2005/0233247 | A1 | * | 10/2005 | Hosoda et al. ......... 430/270.12 |
| 2005/0253210 | A1 | * | 11/2005 | Uno et al. ..................... 257/432 |

* cited by examiner

*Primary Examiner*—Elizabeth Mulvaney
(74) *Attorney, Agent, or Firm*—Oblon, Spivak, McClelland, Maier & Neustadt, P.C.

(57) ABSTRACT

A write once optical recording medium includes a substrate on which an oxide film serving as an inorganic recording film is formed, the oxide film being made of a recording material of an oxide $Ge_1O_x$ (x is an atomic number ratio) of germanium (Ge) and a composition of $Ge_1O_x$ of the oxide film being specified so as to satisfy $1.0 < x < 2.0$.

8 Claims, 4 Drawing Sheets

WRITE ONCE OPTICAL RECORDING MEDIUM

CROSS REFERENCES TO RELATED APPLICATIONS

The present invention contains subject matter related to Japanese Patent Applications JP 2004-134039 filed in the Japanese Patent Office on Apr. 28, 2004 and JP 2005-068205 filed in the Japanese Patent Office on Mar. 10, 2005 and JP2005-118811 filed in the Japanese Patent Office on Apr. 15, 2005 the entire contents of which being incorporated herein by reference.

BACKGROUND OF THE INVENTION

1. Field of the Invention

The present invention relates to a write once optical recording medium.

2. Description of the Related Art

Write once optical recording mediums, for example, write once optical discs using organic dye as recording material constituting their recording layers are widely used as is known well in a write once CD (Compact Disc) and DVD (Digital Versatile Disc), so-called CD-R (Compact Disc-Recordable) and DVD-R (Digital Versatile Disc-Recordable).

On the other hand, various kinds of recording mediums using inorganic recording materials have been proposed so far (see cited patent reference 1, for example).

However, at present, a recording medium using an organic material as a recording material (hereinafter simply referred to as an "organic recording medium") is widely used as compared with a recording medium using an inorganic material as a recording material (hereinafter simply referred to as an "inorganic recording medium".

The reason for this will be described below. That is, when the recording film is made of the inorganic material, freedom of reflectance is small so that the inorganic recording medium cannot be made compatible with a ROM (read-only memory). Further, when it is intended to improve recording characteristics and durability of the inorganic recording medium, the recording film should be composed of a multilayer film and therefore investment in plant and equipment should be required for its manufacturing system, for example, a sputtering system. As a consequence, a cost of the inorganic recording medium is unavoidably increased as compared with the case in which the recording film is made of an organic material.

On the other hand, in the write once optical recording medium using the organic material as its recording material, its recording layer can be deposited by a spin-coat method and it is sufficient that a reflecting film may be deposited on the above-mentioned recording layer. Hence, its manufacturing method is simple and facilities and a cost of its manufacturing system are inexpensive.

On the other hand, density of optical disc has been increased so far by shortening a wavelength of light from mainly a light source and by a numerical aperture (N.A.) of an objective lens. Since a blue semiconductor laser having a wavelength near a short wavelength of 400 nm has been put into practice at present, development of organic dye suitable for use as a light source with such a wavelength becomes necessary.

However, in the organic dye which can satisfy optical characteristics relative to light of a short wavelength, a size of a dye molecule tends to be reduced and freedom in molecule designing is decreased. As a consequence, the organic dye which can be applied to the spin-coat method and which can be satisfactorily recorded by a blue light source with the above-mentioned short wavelength are not yet developed to the extent that it can be put into practice.

Also, in a disc, what might be called a "Blu-ray Disc", which is now commercially available as the standards of the next-generation optical disc, since its numerical aperture (N.A.) is 0.85, a permissible degree of a disc skew is small so that recording and reproducing blue laser light is irradiated on the recording layer from the side of a light transmission layer having a film thickness of 0.1 mm formed on the recording layer.

Then, in the Blu-ray Disc, as described above, in these circumstances in which light is introduced into the recording layer from the side of the light transmission layer, a land (so-called on-groove in the Blu-ray Disc) is standardized as a recording track.

However, when the organic dye film is deposited by a spin-coat method, a groove is fundamentally deposited so as to become thicker than a land.

Accordingly, in the case of the optical recording medium in which the organic dye film deposited by the spin-coat method is used as the recording film and which is advantageous from a standpoint of characteristics, it is desired that groove (so-called in-groove in the Blu-ray Disc) recording with a large film thickness should be used. In this case, a polarity becomes opposite to that of the ordinary case.

Therefore, it is desired that information should be recorded on the land in the recording medium deposited by the spin-coat method. In this case, as described above, when the recording medium is deposited by the spin-coat method, since an organic dye film having a large film thickness is deposited as the recording film within the groove, a problem arises, in which crosstalk between the lands of the recording portion is increased unavoidably.

As described above, in the case of the organic dye, there arises a problem, in which a dye film having a large film thickness is deposited ion the groove. On the other hand, according to the inorganic recording material that can be deposited by a sputtering method, land recording can be employed similarly as a phase-change material which is already commercially available and it is easy to take compatibility with respect to recording characteristics, servo characteristics or the like. Thus, it is to be understood that the recording medium made of the inorganic recording material is advantageous from a standpoint of characteristics.

Further, also in the optical systems of CD-R and DVD-R, it is frequently observed according to a similar reason that the inorganic recording medium will become superior to the organic recording medium.

However, in a recording medium in which a recording layer is formed by a sputtering method as in a phase-change recording medium, when there are many layers constituting the recording layer, a manufacturing process becomes complex and a problem of a cost arises. Accordingly, it is desired that the number of films constituting this write once optical recording medium should be less than three to four layers.

[Cited Patent Reference 1]: Official Gazette of Japanese laid-open patent application No. 11-144316

SUMMARY OF THE INVENTION

In view of the aforesaid aspect, the present invention intends to provide a write once optical recording medium having excellent recording and reproducing characteristics and excellent productivity and which can be produced inexpensively unlike the related-art write once optical recording medium.

Specifically, based on a study in which a write once optical recording medium having excellent recording and reproducing characteristics can be obtained by specifying an arrangement of an inorganic recording film unlike the related-art inorganic recording film, the present invention intends to provide a write once optical recording medium having such recording and reproducing characteristics.

According to an aspect of the present invention, a write once optical recording medium according to the present invention is a write once optical recording medium including an inorganic recording film and the write once optical recording medium is characterized in that the inorganic recording film has an oxide film made of an oxide $Ge_1O_x$ (x is an atomic ratio) of germanium (Ge), a composition of $Ge_1O_x$ of the inorganic recording film being specified so as to satisfy $1.0 < x < 2.0$.

The write once optical recording medium according to the present invention is characterized in that the inorganic recording film includes a metal film formed in contact with the oxide film.

The write once optical recording medium according to the present invention is characterized in that the metal film is composed of a metal film using Ti as a main material.

The write once optical recording medium according to the present invention is characterized in that the metal film is composed of a metal film using Al as a main material.

The write once optical recording medium according to the present invention is characterized in that the metal film is composed of an alloy film made of Al and more than any one kind of Tb, Gd, Dy and Nd of rare earth metals.

The write once optical recording medium according to the present invention is characterized in that the metal film is formed in contact with one surface of the oxide film, a dielectric film being formed on the surface of the opposite side of the side in which it is in contact with the metal film.

The write once optical recording medium according to the present invention is characterized in that the dielectric film is made of SiN.

The write once optical recording medium according to the present invention is characterized in that the dielectric film has a film thickness ranging of from 10 nm to 100 nm.

The write once optical recording medium according to the present invention is characterized in that the oxide film has a film thickness ranging of from 10 nm to 35 nm.

The write once optical recording medium according to the present invention further includes a substrate on which a concave and convex surface of lands and grooves is formed and in which at least the oxide film is formed on the substrate.

The write once optical recording medium according to the present invention is characterized in that the oxide film is composed of a film deposited by a sputtering method.

In the present invention, the main material is referred to as such a material that its composition ratio is highest as compared with those of other elements.

In the write once optical recording medium according to the present invention, since the inorganic recording film includes the oxide film made of the oxide $Ge_1O_x$ of germanium (Ge) and the composition of $Ge_1O_x$ of the inorganic recording film is specified so as to satisfy $1.0 < x < 2.0$, it is possible to construct a write once optical recording medium having excellent recording and reproducing characteristics.

Also, in the write once optical recording medium according to the present invention, an inexpensive high-density medium by a simple inorganic recording film of a film constituted is to be provided.

DESCRIPTION OF THE PREFERRED EMBODIMENTS

The present invention will now be described below with reference to the drawings. While inventive examples of write once optical recording mediums according to the present invention will be described below, it is needless to say that the present invention is not limited to those inventive examples.

Figure 1:
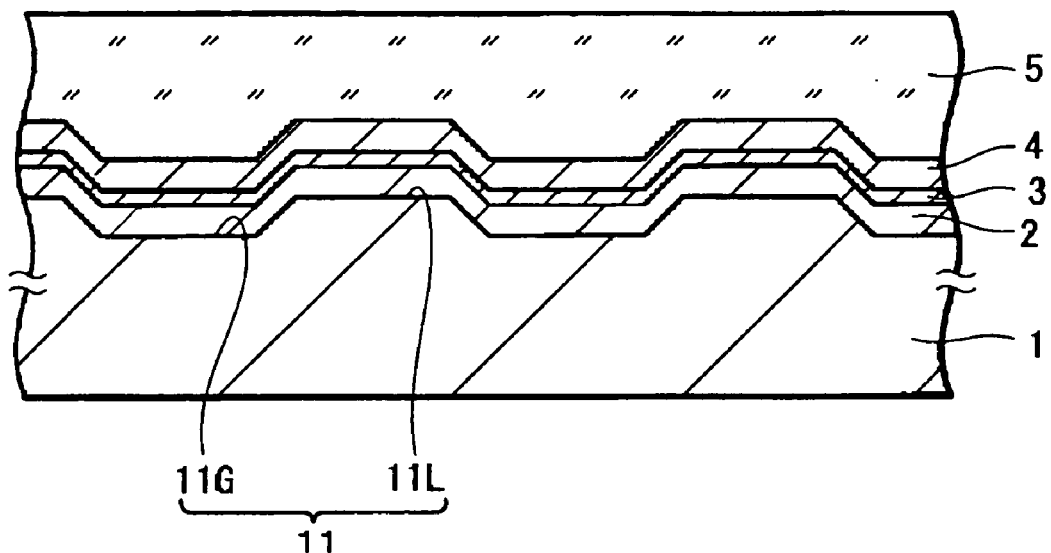
FIG. 1 is a schematic cross-sectional view showing an example of a write once optical recording medium according to the present invention.

FIG. 1 of the accompanying drawings is a schematic cross-sectional view showing an example of a write once optical recording medium 10 according to the present invention.

As shown in FIG. 1, the write once optical recording medium 10 includes a substrate 1 formed of a suitable substrate such as a polycarbonate substrate on which a concave and convex surface 11 with a groove 11G (concavity on the substrate 1 side is referred to as groove) and a land 11L (convexity on the light transmission layer 5 side is referred to as land) formed thereon is formed. On this substrate 1, there are formed a metal film 2 and an oxide film 3 constituting an inorganic recording film and a dielectric film 4, in that order, and on which a light transmission layer 5 is coated.

In this case, the write once optical recording medium 10 may have a write once optical recording medium arrangement suitable for the application to a BD (Blu-ray Disc) having a recording and reproducing wavelength ranging of from 405 nm±5 nm and a numerical aperture (N.A.) of 0.85±0.01. Recording and reproducing light is irradiated on this write once optical recording medium 10 from the side of the light transmission layer 5 having a thickness ranging of from 10 µm to 177 µm.

However, the write once optical recording medium 10 is not limited to the above-mentioned arrangement and it may have an arrangement in which laser light is introduced into the write once optical recording medium 10 from the side of the substrate 1 as will be described later on.

The oxide film 3 constituting the inorganic recording film of the write once optical recording medium 10 according to the present invention may have a composition of $Ge_1O_x$ which is specified so as to satisfy 1.0<x<2.0 and its film thickness may fall within a range of from 10 nm to 35 nm.

Then, in this case, the inorganic recording film has the metal film 2 which is formed in contact with the oxide film 3.

The metal film 2 is mainly made of Ti, and Al may be added to the metal film 2 as an additive if it needs a function of a reflecting film having higher reflectance. As other additives, there can be used Ag, Cu, Pd, Ge, Si, Sn, Ni, Fe, Mg, V, C, Ca, B, Cr, Nb, Zr, S, Se, Mn, Ga, Mo, W, Tb, Dy, Gd, Nd, Zn, and Ta in addition to Al.

Also, the dielectric film 4 is formed in contact with the oxide film 3 such that it may protect the oxide film 3 optically and mechanically, that is, it may improve durability of the oxide film 3 and that it may prevent the inorganic recording film 3 from being deformed upon recording, that is, it may suppress the oxide film 3 from becoming thick. This dielectric film 4 is made of SiN, for example, and its film thickness may fall within a range of from 10 nm to 100 nm.

The light transmission layer 5 may be formed by coating an ultraviolet-curing resin (UV resin), for example, having a thickness of 0.1 mm, for example, when a Blu-ray Disc is constructed.

Also, this light transmission layer 5 can be formed by bonding a PC (polycarbonate) sheet with a PSA (Pressure Sensitive Adhesive) instead of the ultraviolet-curing resin.

Next, inventive examples of the write once optical recording medium according to the present invention will be described.

INVENTIVE EXAMPLE 1

This inventive example 1 is an inventive example corresponding to a Blu-ray Disc (hereinafter simply referred to as a "BD") which can be recorded and reproduced by an optical disc recording and reproducing apparatus including a violet semiconductor laser light source having a wavelength of 405 nm through a two-group objective lens with a numerical aperture (N.A.) of 0.85.

Figure 2:
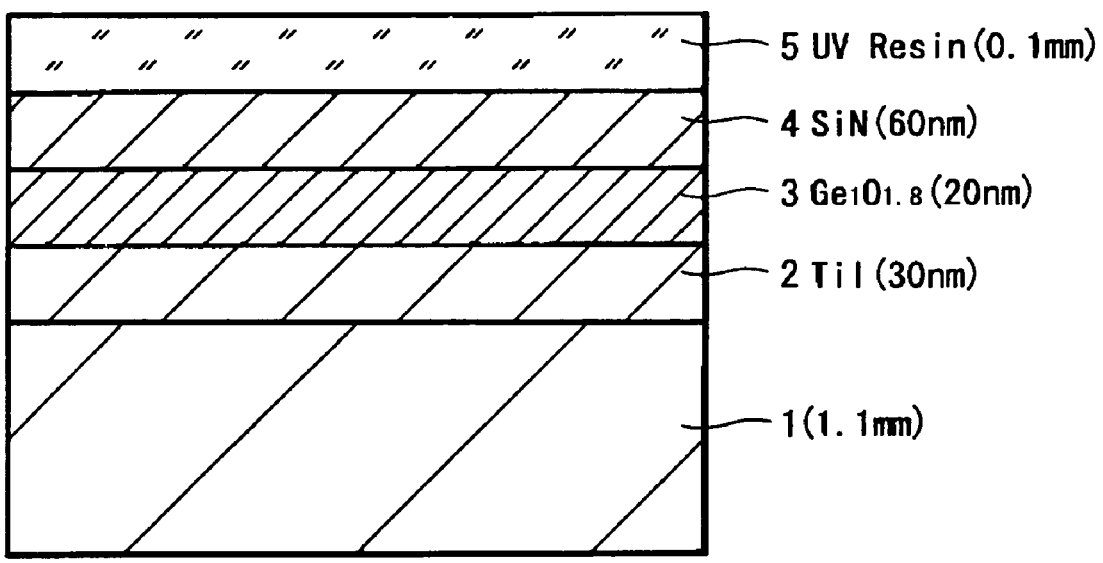
FIG. 2 is a schematic cross-sectional view of a film arrangement showing an arrangement of a write once optical recording medium according to an inventive example 1.

FIG. 2 is a schematic cross-sectional view of a film arrangement showing an arrangement of the write once optical recording medium 10 according to this inventive example 1 from which the concave and convex surface is omitted.

A film deposition system for manufacturing this write once optical recording medium 10 was a film deposition system manufactured by UNAXIS JAPAN CO., LTD., under the trade name of "Cube". A target size used at that time is a diameter $\phi$ of 200 mm.

The substrate 1 may have an arrangement in which the above-mentioned concave and convex surface 11 formed of the land/groove can be formed on one major surface by injection molding of the polycarbonate resin at the same time the disc substrate 1 is molded.

A pitch of this land/groove, that is, a track pitch is 0.32 μm (BD specifications) and a depth of the groove 11G is 20 nm. The light transmission layer 5 was formed by spin-coating the UV resin (ultraviolet-curing resin).

In this case, first, the metal film 2 was deposited on the disc substrate 1 by sputtering Ti so as to have a film thickness of 30 nm. An Ar (argon) gas flow rate required upon sputtering was selected to be 24 sccm and sputtering power was selected to be 1.0 kW.

Next, in the state in which a Ge target was used, an Ar gas flow rate was selected to be 24 sccm and an $O_2$ gas flow rate was selected to be 9 sccm, the oxide film 3 having a film thickness of 20 nm was deposited by a reactive sputtering method. This composition was presented as 1:1.8 by an atomic number ratio. This composition ratio was an observed value measured by a Rutherford backscattering spectroscopy (RBS).

The dielectric film 4 was formed on this oxide film 3 as the protecting film by depositing SiN having a film thickness of 60 nm. This dielectric film 4 was deposited by a reactive sputtering method using a Si target under a mixed gas of Ar gas and $N_2$ gas. The composition of the SiN film is presented as 3:4 by the atomic number ratio and the SiN film has a refractive index of 2.0 and an absorption coefficient of 0.

Characteristics of the thus obtained write once optical recording medium 10 were evaluated by using an optical tester manufactured by PULSTEC INDUSTRIAL CO., LTD., under the trade name of "DDU-1000" in the condition in which a linear velocity was selected to be 5.28 m/s and a channel bit length was selected to be 80.0 nm.

These linear velocity and channel bit length are in conformity with the standards of 23.3 GB density of the BD.

A modulation system is 1-7PP, a shortest mark length is 2T (0.16 μm) and a longest mark length is 8T (0.64 μm). A C/N (carrier-to-noise ratio) of the thus obtained write once optical recording medium 10 was evaluated by a testing machine manufactured by TAKEDA RIKEN INDUSTRY CO., LTD., under the trade name of "TR4171".

When the above-mentioned recording and reproducing characteristics of the write once optical recording medium 10 according to this inventive example 1 were evaluated, a C/N of the mark length 8T could exhibit a high value as 62 dB and a C/N of the mark length 2T could exhibit a value which exceeds 45 dB.

Roughly speaking, as practical standard levels, the C/N of the mark length 2T may be higher than 43 dB and the C/N ratio of the mark length 8T may be higher than 55 dB.

Also, this write once optical recording medium 10 has a degree of modulation of 80% and it exhibited extremely excellent recording and reproducing characteristics. A definition of this degree of modulation is expressed as (18H–18L)/18H where 18H represents a returned light amount of the space portion of the mark length 8T and where 18L represents a returned light amount of the mark length 2T.

In this inventive example 1, reflectance was 10%.

Then, when higher reflectance is required, if Al is added to Ti as the metal film 2, then reflectance higher than 20% can be obtained.

Also, if Ti is used as the main material, then the recording characteristics of this write once optical recording medium 10 are fundamentally satisfactory. As additives for improving optical characteristics of this write once optical recording medium 10 by optimizing the recording and reproducing characteristics or improving durability or increasing recording sensitivity, there can be used Al, Ag, Cu, Pd, Ge, Si, Sn, Ni, Fe, Mg, V, C, Ca, B, Cr, Nb, Zr, S, Se, Mn, Ga, Mo, W, Tb, Dy, Gd and Nd.

Further, $ZnS-SiO_2$, AlN, $Al_2O_3$, $SiO_2$, $TiO_2$, SiC and the like can bed used as the dielectric film 4 in addition to the above-mentioned materials.

In the above-mentioned inventive example 1, since only the three layers of the metal film 2, the oxide film 3 and the dielectric film 4 constitute the write once optical recording medium 10 capable of performing high density recording, this write once optical recording medium 10 is a write once optical recording medium which is advantageous from an industry standpoint.

While the metal film 2 made of Ti is disposed in contact with the oxide film 3 having the composition of $Ge_1O_x$ as the inorganic recording film in the above-mentioned inventive example 1, the case of a write once optical recording medium having a structure in which other film is interposed between these films is shown as a comparative example 1.

COMPARATIVE EXAMPLE 1

A dielectric film made of SiN having a film thickness of 5 nm was deposited between the Ti metal film 2 and the oxide film 3 having the composition of Ti metal film 2 and $Ge_1O_x$ of the inventive example 1 and recording and reproducing experiments similar to those of the inventive example 1 were executed.

When the dielectric film having the film thickness of 5 nm was interposed between the Ti metal film 2 and the oxide film 3 as described above, such dielectric film hardly affects thermal/optical characteristics of the write once optical recording medium. However, this dielectric film may isolate the metal film 2 formed of the Ti film and the oxide film 3 having the composition of $Ge_1O_x$.

As a result, although recording sensitivity is nearly the same as that of the write once optical recording medium of the inventive example 1, reflectance obtained after recording is higher than that obtained before recording, that is, so-called low to high recording could be presented and a degree of modulation became −13% which is an extremely small value as compared with that of the inventive example 1.

A C/N of the mark length 8T became 44 dB and a C/N of the mark length 2T became 31 dB. Hence, recording characteristics were degraded. That is, the Ti film and the $Ge_1O_x$ should be disposed in contact with each other as in the inventive example 1. Specifically, it can be considered that the fact that $Ge_1O_x$ and Ti are reacted at the interface is the recording theory. Accordingly, information can be recorded satisfactorily when a metal material, a metal oxide or the like having high activity is adjoining to the $Ge_1O_x$ and it is to be understood that information can be recorded satisfactorily when both surfaces of the $Ge_1O_x$ are protected with the dielectric films made of the stable material as in the comparative example 1.

Furthers when distribution of the film thickness at the cross-section TEM was checked before and after the recording, it was understood that change in the film thickness of the Ti layer was not recognized, the $Ge_1O_x$ was separated into an oxygen-rich layer and a Ge-rich layer, and an oxygen-rich layer was formed on the Ti layer side. Accordingly, the present invention uses a new recording theory quite different from the aforementioned patent reference 1 having a recording theory in which metals are oxidized.

INVENTIVE EXAMPLE 2

Figure 3:
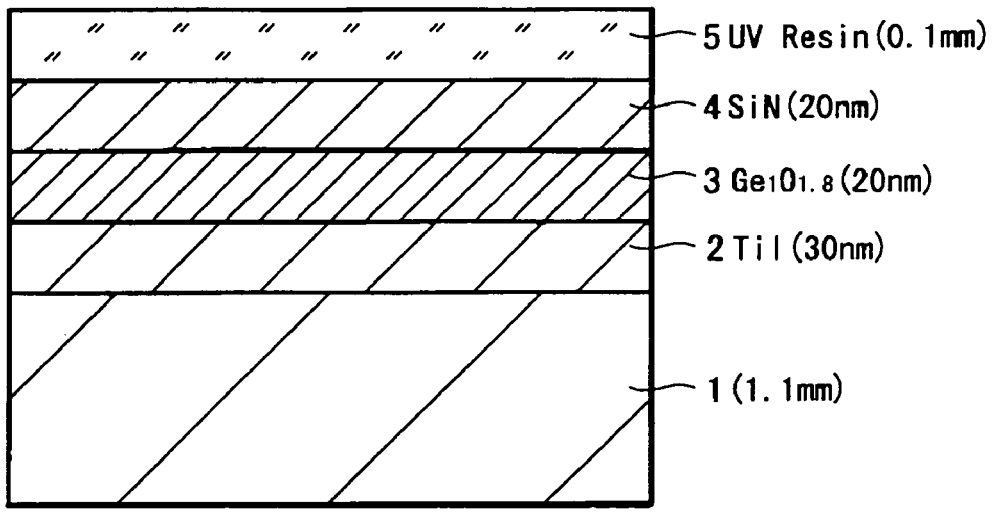
FIG. 3 is a schematic cross-sectional view of a film arrangement showing an arrangement of a write once optical recording medium according an inventive example 2.

FIG. 3 is a schematic cross-sectional view of a film arrangement showing an arrangement of a write once optical recording medium according to an inventive example 2. As shown in FIG. 3, in this inventive example 2, Al was used as the metal film 2 and a film thickness of SiN of the dielectric film 4 was selected to be 20 nm. Other film deposition conditions and evaluation methods were selected to be the same as those of the inventive example 1.

In this case, the reason that the film thickness of the dielectric film 4 is thinner than that of the inventive example 1 is based on an optical reason. That is, since Al used as the metal film 2 remarkably differs from Ti in optical constant, effect of multiple beam interference caused by SiN is different and hence desired reflectance can be obtained by optimizing the film thickness of the SiN film.

According to the write once optical recording medium 10 of this inventive example 2, after information was recorded on this write once optical recording medium 10, it is to be appreciated that returned light of the recording mark became higher than that obtained before recording, that is, so-called low to high recording was presented. However, the C/N of the mark length 8T was 55 dB, the C/N of the mark length 2T was 42 dB and hence recording characteristics thereof were satisfactory.

While this write once optical recording medium 10 cannot meet with the BD standards under this arrangement condition, it can realize the high density recording.

Accordingly, the write once optical recording medium 10 according to this inventive example 2 can be sufficiently used as a write once optical recording medium which is not in conformity with the BD standards. Also, it can be well presumed that this write once optical recording medium 10 can be in conformity with the BD standards by selecting manufacturing conditions.

Then, in the case of this arrangement, durability of this write once optical recording medium 10 could be improved by the Al metal film. Further, also in this case, from a standpoint in which the high density recording can be made by only three layers of the metal film 2, the oxide film 3 and the dielectric film 4 and also from a standpoint in which the SiN dielectric film is thin in thickness, this write once optical recording medium 10 according to this inventive example 2 is a write once optical recording medium which is advantageous from an industry standpoint.

INVENTIVE EXAMPLE 3

Figure 4:
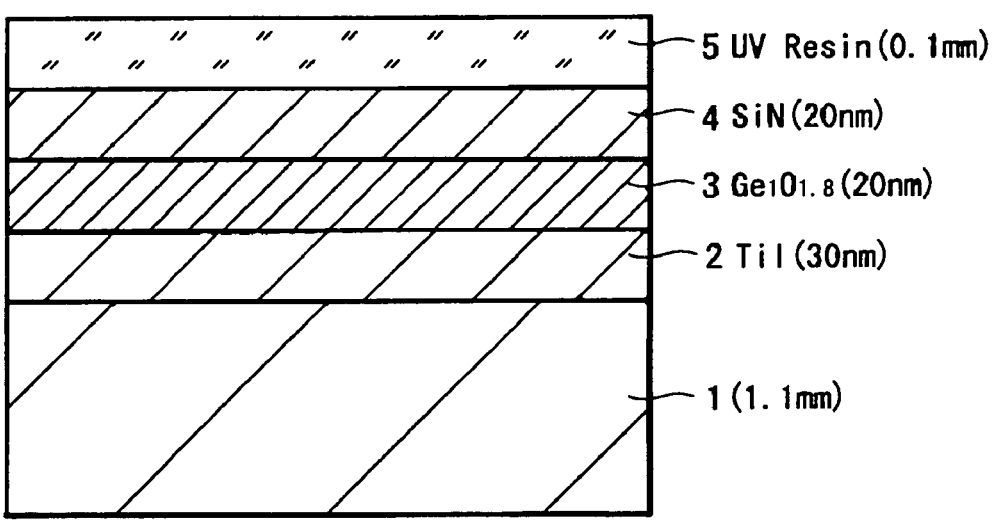
FIG. 4 is a schematic cross-sectional view of a film arrangement showing an arrangement of a write once optical recording medium according to an inventive example 3.

This inventive example 3 is the case in which an alloy of Al and rare earth metal Gd, that is, AlGd is used as the metal film 2 and a rest of arrangements is similar to that of the inventive example 2. In this inventive example 3, the composition of AlGd, that is, Al:Gd (atomicity ratio) was approximately selected to be 7:3 by the atomic number ratio. FIG. 4 is a schematic cross-sectional view of a film arrangement showing an arrangement of a write once optical recording medium 10 according to this inventive example 3.

While rare earth metals are materials which can easily be oxidized and they are low in thermal conductivity, it is possible to adjust recording sensitivity by alloying rare earth metals with Al.

While Tb, Dy and Nd can be used as the rare earth metals in addition to Gd, characteristics of these rare earth metals Tb, Dy and Nd are very similar to each other and hence this inventive example 3 can demonstrate nearly the same characteristics if these rare earth metals are in use.

Also, Fe, Mg, V, Ca, B, Nb, Zr, S, Se, Mn, Ga, Mo and W are enumerated as other materials which can easily be oxidized and similar effects can be achieved. These materials can achieve effects in which recording density can be increased by decreasing thermal conductivity and they can contribute to the improvements of durability depending on the materials.

Then, after information was recorded on and reproduced from this write once optical recording medium 10, it is to be understood that reflectance obtained after recording became lower than that obtained before recording, that is, so-called high to low recording could be presented. Reflectance obtained before recording was approximately 10% and a degree of modulation was 50%. When high to low recording should be made optically by using Al, it is to be understood that addition of added elements is effective.

Also, Cu, Pd, Si, Ni, C, Cr and the like may be effective as the additives which can improve durability of the Al or Ti metal film 2.

INVENTIVE EXAMPLE 4

In this inventive example 4, a write once optical recording medium had the same film arrangement as that of the inventive example 1 and this write once optical recording medium had an arrangement in which oxygen composition x of $Ge_1O_x$ was changed.

In this case, while an oxygen gas flow rate required when the $Ge_1O_x$ film is deposited was being changed in a range of from 6 sccm to 9 sccm, the oxide film 3 was deposited by adjusting a sputtering time such that its film thickness may reach 20 nm. A rest of film deposition conditions is selected to be exactly the same as that of the inventive example 1.

Figure 5:
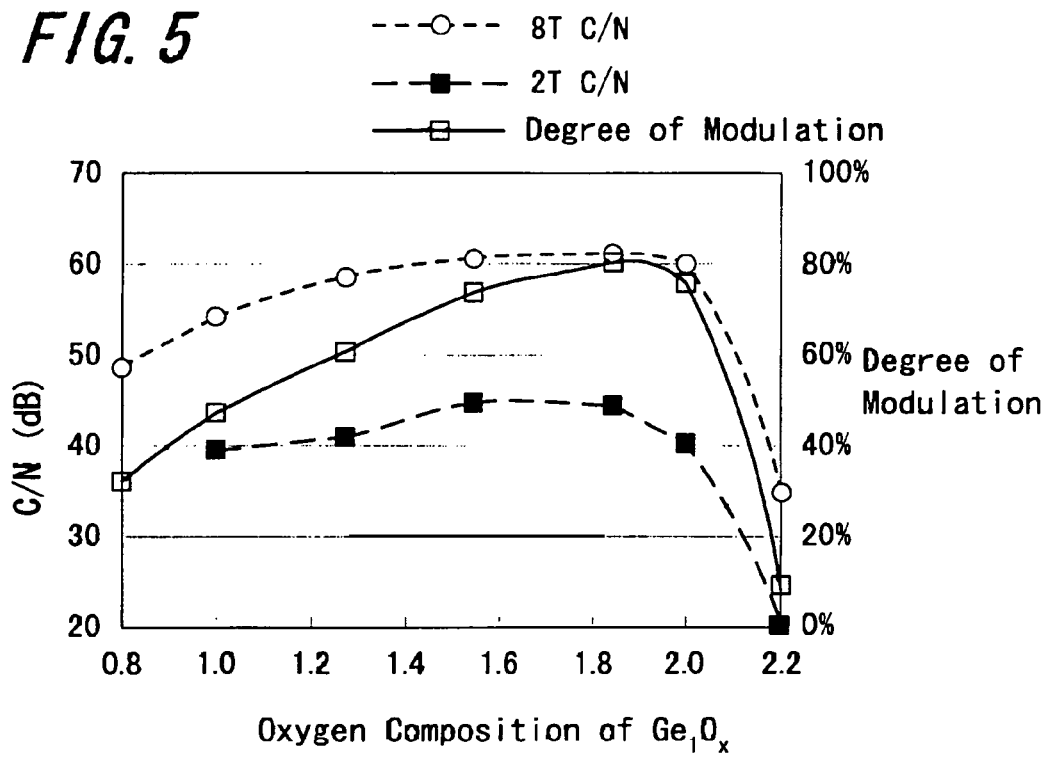
FIG. 5 is a diagram of characteristic curves showing oxygen composition dependence of an oxide film constituting an inorganic recording film relative to a C/N and a degree of modulation of a write once recording medium according to the present invention.

FIG. 5 is a diagram showing experimental results of this inventive example 4. In FIG. 5, the horizontal axis represents the composition of oxygen in actual practice and this is an observed value measured by the RBS (Rathorford Back Scattering) analyzing method.

From FIG. 5, it may become clear that a degree of modulation increases as the composition of oxygen increases up to a range of x=1.84 and that a C/N of the mark length 2T is high up to a range of x<2.0. Also, when x is less than 1.0, the C/N of the mark length 2T becomes lower than 40 dB. Also, a degree of modulation also is lowered to approximately 40% and it is to be understood that recording characteristics are deteriorated obviously.

Also, when the oxide film 3 was deposited in a range of $x \geq 2.0$, recording characteristics were deteriorated and as a result, information could not be recorded any more. The reason for this may be considered that $Ge_1O_2$ has a stable composition.

That is, a range of the oxygen composition which is preferable as $Ge_1O_x$ falls within a range of 1.0<x<2.0 and it should be more preferable that it falls within a range of 1.3<x<1.8.

INVENTIVE EXAMPLE 5

In this inventive example 5, a write once optical recording medium has the same film arrangement as that of the inventive example 1 and in which the film thickness of the inorganic recording film 3 of $Ge_1O_{1.8}$ was changed. Parameters other than the changes of the film thickness and the film deposition method and the like are all selected to be the same as those of the inventive example 1. Experimental results of the write once optical recording medium according to this inventive example 5 are shown in FIG. 6.

Figure 6:
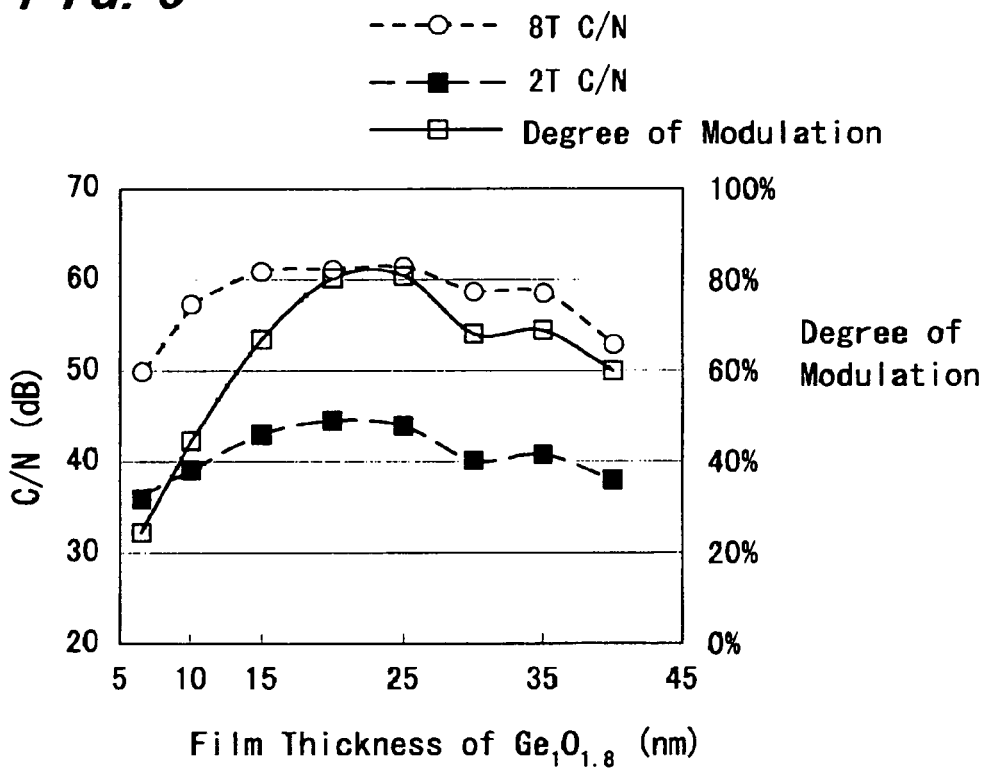
FIG. 6 is a diagram of characteristic curves showing oxygen composition dependence of an oxide film constituting an inorganic recording film relative to a C/N and a degree of modulation of a write once recording medium according to the present invention.

A study of FIG. 6 reveals that the degree of modulation and the carrier-t-noise ratios of the mark lengths 8T and 2T are highest when the film thickness of the oxide film 3 is approximately 20 nm and that these degree of modulation and carrier-to-noise ratios are lowered when the film thickness of the oxide film 3 is larger than or smaller than 20 nm.

Then, when the film thickness of the oxide film 3 is less than 10 nm, it becomes clear that a degree of modulation becomes less than 40%, the C/N of the mark length 2T becomes less than 40 dB and that recording characteristics begin to deteriorate. Also, the C/N of the mark length 2T is higher than 40 dB until the film thickness of the oxide film 3 is 35 nm. Accordingly, the film thickness of $Ge_1O_{1.8}$ is selected in a range of from 10 nm to 35 nm. The C/N at the mark length 8T is higher than 50 dB in a whole range of measured thicknesses of the inorganic recording film 3.

That is, the optimum film thickness of the $Ge_1O_{1.8}$ layer is 20 nm and the effects of the present invention can be achieved so long as the film thickness of the oxide film 3 lies within a range of from 10 nm to 35 nm.

COMPARATIVE EXAMPLE 2

In this comparative example 2, except for the fact that the film thickness of the dielectric film 4 was selected to be 10 nm, a write once optical recording medium had an arrangement similar to that of the inventive example 2 shown in FIG. 3.

After information was recorded on this write once optical recording medium similarly to the inventive example 2, it is to be understood that a recording noise was increased remarkably so that the C/N at the recording mark length 8T was lowered to about 40 dB. The reason for this may be considered that rigidity of the dielectric film 4 becomes insufficient. Accordingly, it is preferable that the film thickness of the dielectric film 4 should be selected to be larger than 10 nm.

Also, since this dielectric film 4 functions as the protecting film of the oxide film 3 as well, from a protection standpoint, it is preferable that the film thickness of the dielectric film 4 should be selected to be as large as possible. From a mass-productivity standpoint, it is preferable that the film thickness of the dielectric film 4 should be selected to be less than 100 nm. Also, the effects of the present invention can be achieved in a range of this film thickness of the dielectric film 4.

However, the optimum film thickness of the dielectric film 4 is changed depending on the material of the metal film 2 and the material of the dielectric film 4 and hence it cannot be determined uniquely.

In the case of the inventive example 1, for example, the optimum film thickness of the dielectric film 4 was 60 nm, and in the case of the inventive example 2, the optimum film thickness of the dielectric film 4 was 20 nm. Further, when the dielectric film 4 is made of $SiO_2$, its refractive index is nearly the same as those of the disc substrate 1 and the light transmission layer 5 and any film thickness can be used from an optical standpoint. Thus, it is possible to optimize the film thickness of the dielectric layer 4 only from the standpoints of durability, mass-productivity and recording characteristics.

Further, the dielectric film 4 need not be formed of a single layer and it can be divided into more than two layers like $SiN/SiO_2$ and $ZnS-SiO_2/SiN$. Also in this case, the effects of the present invention can be achieved in exactly the same manner.

INVENTIVE EXAMPLE 6

This case describes an example using an optical tester using an optical system having a wavelength of 650 nm and a lens numerical aperture (N.A.) of 0.6.

Figure 7:
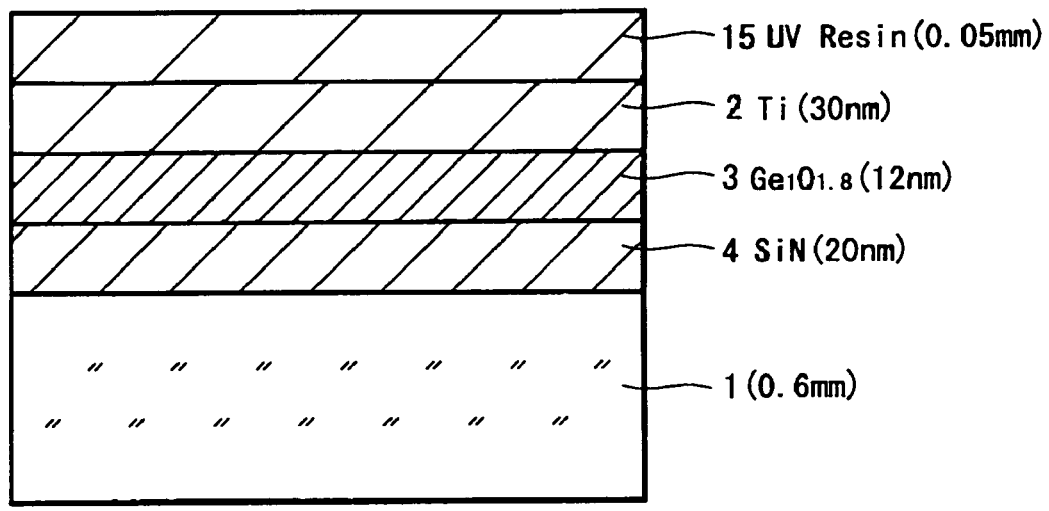
FIG. 7 is a schematic cross-sectional view of a film arrangement showing an arrangement of a write once optical recording medium according to an inventive example 6.

FIG. 7 is a schematic cross-sectional view of a film arrangement showing an arrangement of a write once optical recording medium 10 according to the inventive example 6. As shown in FIG. 7, light is introduced into this write once optical recording medium 10 from the side of the substrate 1 formed of a 0.6 mm-thick polycarbonate substrate. In this case, this write once optical recording medium 10 has an arrangement in which an SiN dielectric film 4 having a film thickness of 20 nm, a $Ge_1O_x$ (x=1.8) oxide film 3 having a film thickness of 12 nm, a Ti metal film 2 having a film thickness of 30 nm and a protecting layer 15 having a film thickness of 0.05 mm with a UV resin spin-coated thereon are deposited on the substrate 1, in that order.

The substrate 1 has an arrangement including the concave and convex surface having a track pitch of 0.74 μm and a groove depth of 40 nm.

In this inventive example 6, there was used the optical tester manufactured by PULSTEC INDUSTRIAL CO., LTD., under the trade name of "DDU-1000". After information was recorded on this write once optical recording medium 10 by the same parameters as those of the DVD-R, a degree of modulation of 50% was obtained and 55 dB was obtained as the C/N of the mark length 8T in the EFM + (Eight-to-fourteen Modulation +), which can reveal that satisfactory recording could be made. Also, when a TiAl film (atomic composition ratio of Al is 30%) is used as a metal film 2, reflectance was increased slightly.

As described above, the present invention may not be limited to a specific light wavelength and a specific numerical aperture of an objective lens. Further, it was confirmed that similar effects can be achieved regardless of whether light is introduced into the write once optical recording medium from the substrate side or the light transmission layer side.

For example, the present invention can be applied to the case in which a wavelength is 400 nm, the numerical aperture (N.A.) falling within a range of from 0.6 to 0.8 or the present invention can be applied to an optical system of a CD-R.

As described above, according to the arrangement of the present invention, since the recording film can be formed as the inorganic recording film so that the film arrangement can be formed as the sputtered film arrangement, as mentioned hereinbefore, it is possible to solve the problem in which the write once optical recording medium is not made compatible with the ROM because of the increased film thickness of the groove due to spin-coating.

Also, as described above, according to the arrangement of the present invention, it is possible to obtain the write once optical recording medium which is excellent in recording characteristics and durability.

Since satisfactory recording characteristics can be obtained by the extremely lesser number of layers such as three layers of the metal film 2, the oxide film 3 and the dielectric film 4, the write once optical recording medium is excellent in mass-productivity. Also, since this write once optical recording medium has the lesser number of layers, it is possible to decrease a cost of the write once optical recording medium, such as to decrease a ratio at which defective products are produced.

As set forth above, according to the present invention, while satisfactory recording and reproduction can be fundamentally carried out by the above-mentioned three layers, the present invention is not limited to the above-mentioned inventive examples and it can be variously applied to the cases such as when a metal film and a dielectric film can be provided in addition to the above-mentioned three layers in order to further increase reflectance in response the mode or purpose in which the write once optical recording medium is in use or in order to improve durability and so on.

In the write once optical recording medium according to the present invention, since the inorganic recording film includes the oxide film made of the oxide $Ge_1O_x$ of germanium (Ge) and the composition of $Ge_1O_x$ of the inorganic recording film is specified so as to satisfy $1.0<x<2.0$, it is possible to construct a write once optical recording medium having excellent recording and reproducing characteristics.

Also, since the write once optical recording medium according to the present invention includes the inorganic recording film, the inorganic recording film can be deposited by a sputtering method.

Accordingly, when the substrate constituting the write once optical recording medium has the concave and convex surface of lands and grooves formed thereon, it is possible to avoid a recording material from being intensively filled into the grooves.

Therefore, it is possible to avoid recording and reproducing characteristics of the two recording layers of the land and groove from being changed remarkably and hence a so-called land/groove recording in which information can be recorded on both of the land and groove, for example, becomes possible.

Further, it is possible to avoid a problem of a polarity even when the write once optical recording medium has a bonded bilayer recording layer arrangement.

It should be understood by those skilled in the art that various modifications, combinations, sub-combinations and alterations may occur depending on design requirements and other factors insofar as they are within the scope of the appended claims or the equivalents thereof.

What is claimed is:

1. A write once recording medium comprising an inorganic recording film, said inorganic recording film including an oxide film made of oxide $Ge_1O_x$ (x represents an atomic ratio) of germanium (Ge) and a composition of $Ge_1O_x$ of said inorganic recording film being specified so as to satisfy $1.0<x<2.0$, wherein said inorganic recording film includes a metal film formed in contact with said oxide film and said metal film is formed of Ti as a main material thereof.

2. The write once optical recording medium according to claim 1, wherein said metal film comprises Al.

3. A write once optical recording medium comprising an inorganic recording film, said inorganic recording film including an oxide film made of oxide $Ge_1O_x$ (x represents an atomic ratio) of germanium (Ge) and a composition of $Ge_1O_x$ of said inorganic recording film being specified so as to satisfy $1.0<x<2.0$, wherein said inorganic recording film includes a metal film formed in contact with said oxide film and said metal film is formed of Ti as a main material thereof, and said metal film is composed of Al and more than any one kind of Tb, Gd, Dy and Nd of rare earth metals.

4. A write once optical recording medium comprising an inorganic recording film, said inorganic recording film including an oxide film made of oxide $Ge_1O_x$ (x represents an atomic ratio) of germanium (Ge) and a composition of $Ge_1O_x$ of said inorganic recording film being specified so as to satisfy $1.0<x<2.0$, wherein said inorganic recording film includes a metal film formed in contact with said oxide film and said metal film is formed of Ti as a main material thereof, and said oxide film has said metal film formed in contact with one surface thereof and includes a dielectric film formed on an opposite side of a surface in which said oxide film is in contact with said metal film.

5. A write once optical recording medium comprising an inorganic recording film, said inorganic recording film including an oxide film made of oxide $Ge_1O_x$ (x represents an atomic ratio) of germanium (Ge) and a composition of $Ge_1O_x$ of said inorganic recording film being specified so as to satisfy $1.0<x<2.0$, wherein said inorganic recording film includes a metal film formed in contact with said oxide film and said metal film is formed of Ti as a main material thereof, and said oxide film has said metal film formed in contact with one surface thereof and includes a dielectric film formed on an opposite side of a surface in which said oxide film is in contact with said metal film said dielectric film is made of SiN.

6. A write once optical recording medium comprising an inorganic recording film, said inorganic recording film including an oxide film made of oxide $Ge_1O_x$ (x represents an atomic ratio) of germanium (Ge) and a composition of $Ge_1O_x$ of said inorganic recording film being specified so as to satisfy $1.0 < x < 2.0$, wherein said inorganic recording film includes a metal film formed in contact with said oxide film and said metal film is formed of Ti as a main material thereof, and said oxide film has said metal film formed in contact with one surface thereof and includes a dielectric film formed on an opposite side of a surface in which said oxide film is in contact with said metal film wherein said dielectric film has a film thickness ranging of from 10 nm to 100 nm.

7. A write once optical recording medium according to claim 1, wherein said oxide film has a film thickness ranging of from 10 nm to 35 nm.

8. A write once optical recording medium according to claim 1, further comprising:

a substrate on which a concave and convex surface of lands and grooves is formed and in which at least said oxide film is formed on said substrate.

* * * * *